(12) United States Patent
Caretti Giangaspro et al.

(10) Patent No.: US 11,739,415 B2
(45) Date of Patent: Aug. 29, 2023

(54) CONDUCTIVE SPUTTER TARGETS WITH SILICON, ZIRCONIUM AND OXYGEN

(71) Applicant: SOLERAS ADVANCED COATINGS BV, Deinze (BE)

(72) Inventors: Ignacio Caretti Giangaspro, Antwerp (BE); Wilmert Cyriel Stefaan De Bosscher, Drongen (BE); David Karel Debruyne, Ghent (BE); Guy Gobin, Ostend (BE); Freddy Fack, Mariakerke (BE); Hubert Eliano, Scheldewindeke (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 239 days.

(21) Appl. No.: 17/291,569

(22) PCT Filed: Nov. 12, 2019

(86) PCT No.: PCT/EP2019/081074
§ 371 (c)(1),
(2) Date: May 5, 2021

(87) PCT Pub. No.: WO2020/099438
PCT Pub. Date: May 22, 2020

(65) Prior Publication Data
US 2021/0395878 A1 Dec. 23, 2021

(30) Foreign Application Priority Data
Nov. 12, 2018 (BE) .................................. 2018/5796

(51) Int. Cl.
*C23C 14/34* (2006.01)
*C01G 25/02* (2006.01)

(52) U.S. Cl.
CPC .......... *C23C 14/3414* (2013.01); *C01G 25/02* (2013.01); *C01P 2002/72* (2013.01); *C01P 2006/40* (2013.01)

(58) Field of Classification Search
CPC ............ C23C 14/3414; C23C 14/0036; C23C 14/0676; C23C 14/08; C23C 4/11;
(Continued)

(56) References Cited

U.S. PATENT DOCUMENTS 5,354,446 A 10/1994 Kida et al.
10,347,472 B2 7/2019 Simons et al.
(Continued)

FOREIGN PATENT DOCUMENTS

CN 105593400 A 5/2016
CN 108431292 A 8/2018
(Continued)

OTHER PUBLICATIONS

International Search Report and Written Opinion from PCT Application No. PCT/EP2019/081074, dated Feb. 6, 2020.
(Continued)

*Primary Examiner* — Rodney G McDonald
(74) *Attorney, Agent, or Firm* — WORKMAN NYDEGGER

(57) ABSTRACT

A target for sputtering comprises $SiZr_xO_y$ wherein x is higher than 0.02 but not higher than 5, and y is higher than 0.03 but not higher than $2*(1+x)$, wherein the target has an XRD pattern with silicon 2-theta peak at 28.29°+/−0.3°, or a tetragonal phase $ZrO_2$ 2-theta peak at 30.05°+/−0.3°. The target has a low resistivity, below 1000 ohm·cm, preferably below 100 ohm·cm, more preferably below 10 ohm·cm, even lower than 1 ohm·cm.

8 Claims, 7 Drawing Sheets

(58) Field of Classification Search
CPC ....... C23C 4/06; C23C 4/18; C04B 2235/765;
C04B 2235/78; C04B 2235/96; C04B
35/481; H01J 37/3426; C01G 25/02;
C01P 2006/40; C01P 2002/72
USPC .................................. 204/298.12, 298.13
See application file for complete search history.

(56) References Cited

U.S. PATENT DOCUMENTS

| | | |
|---|---|---|
| 10,475,630 B2 | 11/2019 | Simons et al. |
| 2011/0100809 A1 | 5/2011 | Delrue et al. |
| 2012/0055783 A1 | 3/2012 | Billieres et al. |
| 2016/0260590 A1 | 9/2016 | Simons et al. |
| 2018/0155820 A1 | 6/2018 | Simons et al. |

FOREIGN PATENT DOCUMENTS

| | | |
|---|---|---|
| EP | 3032566 A1 | 6/2016 |
| EP | 3184663 A1 | 6/2017 |
| JP | 2018040032 A | 3/2018 |
| WO | 2010003947 A1 | 1/2010 |
| WO | 2017108271 A1 | 6/2017 |

OTHER PUBLICATIONS

Belgian Search Report from corresponding Application No. BE 201805796, dated May 7, 2019.
Oberste-Berghaus et al., "Film Properties of Zirconium Oxide Top Layers from Rotatable Targets," 58th Annual Technical Conference Proceedings, Apr. 25-30, 2015, pp. 228-234, Society of Vacuum Coaters.
Chinese Office Action from corresponding Chinese Patent Application No. 201980073212.3, dated Dec. 5, 2022.

CONDUCTIVE SPUTTER TARGETS WITH SILICON, ZIRCONIUM AND OXYGEN

FIELD OF THE INVENTION

The present invention relates to the field of silicon zirconium oxide sputter targets. More specifically it relates to conductive silicon zirconium oxide sputter targets, and to a method of manufacturing such targets.

BACKGROUND OF THE INVENTION

Many applications (such as protection of surfaces, optical, tribological, etc.) require the presence of a layer or layers of material covering a substrate, which confers specific and predetermined properties to the surface of the substrate. A typical technique, suitable for many types of materials and specific applications, is deposition of material by sputtering.

The technique of material deposition by means of sputtering is known already for many decades. Typically a plasma is generated in a low pressure chamber in which an inert gas such as argon, or an active gas such as oxygen or nitrogen is present, and a high voltage is applied between a so called "sputter target" (containing the material to be deposited) and a "substrate" upon which a layer of the sputter material is to be deposited. The gas atoms can be ionized, and the sputter target is bombarded by the gas atoms, so that atoms are freed from the sputter target, and move to the substrate, where they are deposited.

Typically three kinds of power source are being used: DC power, AC or pulsed power (in the range of kHz, e.g. at a frequency of 1 to 100 kHz) and RF power (in the range of MHz, e.g. at a frequency of 0.3 to 100 MHz). DC power is typically used when the sputter target contains an electrically conductive sputter material. AC power is typically used when the deposited layer has low conductivity, or it is dielectric. Although high frequency power (RF power) enables the sputtering of material with low conductivity, the sputtering area is limited, due to standing wave effects. Moreover, deposition becomes non-uniform, and the sputter rate for same power levels is typically significantly lower than a DC process.

Some types of layers are thus difficult to obtain, for example dielectric layers. For instance, oxidic films are often desired because they can be made with selectable transparency, making them suitable for optical applications such as lenses, filters, and the like. Amorphous films are preferred as they are usually durable and resistant to abrasion. However, deposition of oxidic films is difficult for reasons explained in the following.

It is possible to provide oxide layers by deposition, by sputtering a metal target with a gas mixture including oxygen. However, this may result in severe hysteresis behavior, which leads to process instability. The relatively high amount of oxygen gas for some applications may lead to a drop of sputter rate. The document "OBERSTE-BERGHAUS et al., Film Properties of Zirconium Oxide Top Layers from Rotatable Targets, 2015 Society of Vacuum Coaters, 58th Annual Technical Conference Proceedings, Santa Clara, Calif. Apr. 25-30, 2015, p. 228-234" discloses that the use of ceramic targets can alleviate the hysteresis behavior, and allow three times higher film deposition rates over sputtering processes using metal targets.

The oxygen in the gas mixture may also cause parasitic arcing on the target. Ceramic targets may allow use quasi non-reactive sputtering, which reduces arcing, as disclosed in US2012055783.

However, providing a sputter coating based on non-conductive target materials is a challenge, and it may require high frequency power systems. Coupling the signal capacitively through the target may allow establishing a self-bias on the target surface for attracting positive ions from the plasma that were generated by the oscillating electrons in front of the target. RF sputtering requires additional adjustments for coupling the power to the non-conductive target, for example an electronic matching unit or specially shaped and distributed electrodes for providing a uniform electrical field for sputtering, as disclosed in EP3032566. In case of rotating cylindrical magnetrons, power delivery is further limited to a position corresponding to the ends of the target tube, which may severely impact the uniformity of the plasma density and, hence, the sputter rate along the target tube. Furthermore, RF sputtering equipment is significantly more expensive for realizing similar sputter rates in comparison to DC or AC sputtering.

SUMMARY OF THE INVENTION

It is an object of the present invention to provide good sputter targets, and methods for producing the same, which allows providing layers including oxides or oxynitrides of silicon and zirconium in a way being compatible with industrial and large area coating systems.

The above objective is accomplished by a method and device in accordance of the present invention.

In a first aspect, the present invention provides a target for sputtering, comprising $SiZr_xO_y$ wherein x (for Zr) is higher than 0.02 but not higher than 5, and y (for O) is higher than 0.03 but not higher than $2*(1+x)$. A target in accordance with embodiments of the present invention has an XRD pattern with a silicon 2-theta peak at 28.29°+/−0.30°, and/or a tetragonal phase $ZrO_2$ peak at 30.05°+/−0.30°.

A target according to embodiments of the present invention may be a $SiZr_xO_y$ target, meaning that the majority of the target material is $SiZr_xO_y$.

A target in accordance with embodiments of the present invention may have a lamellar structure.

In a target according to embodiments of the present invention, the $SiZr_xO_y$ fraction has a lamellar structure consisting of microscopic splats of material. A lamellar structure comprises fine, distinguishable layers (at microscopic level), called lamellae. In the present invention, the lamellae are formed by splats of raw material that has been projected in molten form onto a backing substrate of the target. In embodiments of the present invention, the lamellae may be layers with a thickness between 0.1 μm and 10 μm. The composition of the lamellae depends on the raw materials that have been projected.

In embodiments of the present invention, the lamellar structure is due to a spraying process, for instance—but not limited thereto—a thermal spraying process.

In embodiments of the present invention, the target comprises more than 90% of Si, Zr, and O elements. The target may comprise 50 at % or more of $SiZr_xO_y$ compound. In embodiments of the present invention, the target has a resistivity below 1000 ohm·cm, preferably below 100 ohm·cm, more preferably below 10 ohm·cm, even lower than 1 ohm·cm. It is an advantage of embodiments of the present invention that the target presents a conductivity high enough so that it can be used with low-frequency AC sputtering process or even DC sputtering process, suitable for providing optical coatings.

In a target in accordance with particular embodiments of the present invention, x may be higher than 0.05 but lower than 1, preferably between 0.1 and 0.5, and y may be higher than 0.1 but lower than 2*(0.6+x), preferably between 0.2 and 2*(0.3+x). It is an advantage of embodiments of the present invention that the refraction index n can be controlled accurately.

A target in accordance with embodiments of the present invention may comprise lamellas consisting of Si and lamellas consisting of $ZrO_z$, where z is higher than 0.25 but lower than or equal to 2. In particular embodiments, the lamellas consisting of $ZrO_z$ may comprise sub-oxidic zirconium oxide. It is an advantage of embodiments of the present invention that a sub-oxidic composition of the lamellas may reduce resistivity of target and may reduce arcing.

A target in accordance with embodiments of the present invention may comprise at least 1 wt % of lamellas consisting of a mixed oxide compound, for example $SiZr_nO_m$, e.g. where n and m provide sub-oxidic composition.

It is an advantage of embodiments of the present invention that a high sputtering rate can be obtained.

A target in accordance with embodiments of the present invention may further comprise metallic particles. It is an advantage of embodiments of the present invention that a controllable and low resistance of the target can be obtained, by tailoring the type and amount of metal particles included in the target.

In a second aspect, the present invention provides a method for manufacturing a conductive $SiZr_xO_y$ target for sputtering, wherein x is higher than 0.02 but not higher than 5, and y is higher than 0.03 but not higher than 2(x+1). The method comprises:

providing powder comprising particles of zirconium and of silicon oxide or silicon suboxide; and/or comprising particles of silicon and of zirconium oxide or zirconium suboxide; and/or comprising particles of silicon suboxide and zirconium suboxide; and/or comprising particles of a silicon zirconium oxide compound, providing a backing substrate, and projecting the powder in a molten form onto the backing substrate, in such quantities that a target for sputtering is obtained with a composition of $SiZr_xO_y$, wherein x is higher than 0.02 but not higher than 5, and y is higher than 0.03 but not higher than 2(x+1), and cooling and solidifying the projected powder.

It is an advantage of embodiments of the present invention that a conductive sputter target can be provided for providing silicon zirconium oxide layers. It is also an advantage of embodiments of the present invention that a conductive sputter target can be performed in pure nitrogen or in nitrogen/argon reactive atmosphere for providing silicon zirconium oxynitride layers, with little or no use of oxygen in the gas mixture. It is an advantage that fire hazard can be reduced, because zirconium powder may not be available per se.

The method in accordance with embodiments of the present invention may comprise spraying, for example thermally spraying, for projecting the powder.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
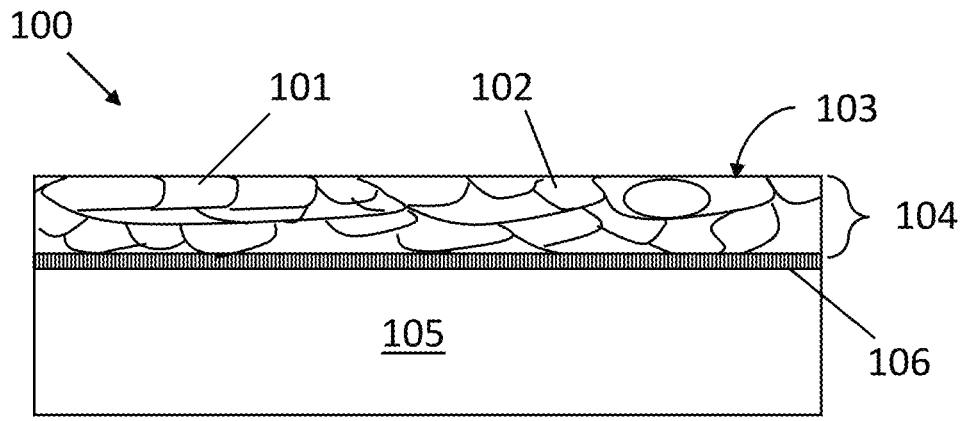
FIG. 1 illustrates a cross section of a target for sputtering in accordance with embodiments of the present invention, with target material on top of a backing substrate.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B; but it can, however, also encompass devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is to be understood that embodiments of the invention may be practiced without these specific details. In other instances, well-known methods, structures and techniques have not been shown in detail in order not to obscure an understanding of this description.

Where in embodiments of the present invention reference is made to a composition of silicon zirconium oxide (SZO), reference is made to a composition comprising Si, x atoms of Zr per atom of Si, and y atoms of O per atom of Si, where x and y are different from 0.

Sputter targets comprising silicon zirconium oxides can provide a substrate with an oxide or oxynitride silicon zirconium coating with specific mechanical, optical and chemical properties. Some applications of the sputtered coatings can be as protective overcoat of an optical stack or UV blocker, as a layer of high refractive index which may improve the functionality of an optical stack (e.g. as a reflection preventive coating), etc.

A problem with silicon zirconium oxides for use as a target material is that the material usually has high electrical resistance, which renders the target electrically insulating. The disadvantage of electrically insulating targets is that it is not possible to sputter at DC or at medium frequency AC but that sputtering at RF is required.

The present invention relates to sputter targets and the manufacturing thereof, the targets comprising $SiZr_xO_y$ which, when used for sputtering, may provide layers such as optical layers (e.g. layers with a predetermined and controllable refraction index), with good chemical and abrasion resistance.

In a first aspect, the present invention provides a sputter target including or made of $SiZr_xO_y$ wherein the amount x of Zr is higher than 0.02 but not higher than 5 atoms of Zr per atom of Si, and the amount y of oxygen is higher than 0.03 but not higher than $2*(1+x)$ atoms of O per atom of Si (or $0.02 < x \leq 5$ and $0.03 < y \leq 2*(1+x)$). For example, the compositions may be more preferably $0.05 < x < 1$ and $0.1 < y < 2*(0.6+x)$, for example with $0.1 < x < 0.5$ and $0.2 < y < 2*(0.3+x)$. The composition may be tuned for achieving the desired balance of optical properties (e.g. non-absorbing and having a desired refractive index), mechanical properties (e.g. low friction and higher hardness) and chemical properties (e.g. having higher corrosion resistance).

The targets of the present invention are electrically conductive. For example, such targets may have a resistivity below 1000 ohm·cm, preferably below 100 ohm·cm, more preferably below 10 ohm·cm, even lower than 1 ohm·cm. Thus, these targets can advantageously be sputtered in standard DC, or pulsed DC, or in medium frequency AC, between 5 Hz and 500 kHz, typically between 100 Hz and 100 kHz. This allows forming a uniform film at high speed, even over a large surface area of a substrate.

The target material may have a lamellar structure. They may be produced by spraying, for instance by thermal spraying.

FIG. 1 shows a cross section of a target 100 or part thereof, showing target material 104 with a predetermined thickness over a backing substrate 105. The target material comprises $SiZr_xO_y$, wherein x is higher than 0.02 but not higher than 5, and y is higher than 0.03 but not higher than $2*(1+x)$, with a resistivity below 1000 ohm·cm, preferably below 100 ohm·cm, more preferably below 10 ohm·cm, even lower than 1 ohm·cm.

In embodiments of the present invention, as shown in FIG. 1, the $SiZr_xO_y$ target 100 includes lamellas 101, 102 of heterogeneous compositions whose size will depend on the composition of the target. These lamellas may include or consist of splats and may include silicon, e.g. pure silicon, a zirconium oxide ($ZrO_Z$, where z is higher than 0.05, for instance higher than 0.25, but lower than or equal to 2), or a combination of silicon and zirconium oxide. It is noted that the relative sizes in the figure are not on scale and are exaggerated in order to show the lamellas.

Further, the target may include lamellas with a sub-oxidic Si composition, a sub-oxidic Zr composition, or a combination of both.

In particular embodiments, the lamellas including $ZrO_Z$ comprise a sub-oxidic composition of $ZrO_Z$. With "sub-oxidic composition" is meant an oxide composition wherein the quantity of oxygen is reduced as compared to stoichiometric quantities, for example in $ZrO_Z$ z may be strictly under 2, preferably about 1.9 and most preferably about 1.8. A sub-oxidic composition lacks oxygen, resulting in oxygen vacancies, which may lead to free charge carries and conductivity as well. Thus, the target may present high ionic conductivity thanks to the presence of such sub-oxidic material.

The resistivity of the coating may be tuned by using targets including Si with tailored resistivity, for example lamellas with high purity Si, or lamellas including B-doped silicon.

The target in accordance with embodiments of the present invention may also present high electric conductivity, thanks to the presence of metallic particles, e.g. Ti, Zr, Nb, W, Cu, Al, B, etc.

Additionally, reducing the resistivity differences with adjacent lamellas (e.g. with silicon lamellas) also reduces or prevents arcing phenomena.

In some embodiments of the present invention, the target presents good and homogeneous mixing at a microscopic level, which improves homogeneity of the sputtering of the target.

In embodiments of the present invention, the target may also comprise at least 1 wt. % of a $SiZr_nO_m$ mixed oxide compound. In some embodiments, it may be a sub-oxidic compound, where n and m provide a sub-oxidic composition.

In embodiments of the present invention, the target has a lamellar structure, which typically occurs due to spraying process of manufacturing targets. In the particular case of ceramic, non-plastically deformable particles, thermal spraying may provide lamellar structure. However, the present invention is not limited to spraying and other techniques, such as for instance a laser cladding process, may provide lamellar structure. The different lamellas may have different degrees of crystallinity, different densities, etc. The lamellas may be formed by microscopic splats of material, having an average volume of 0.0001 mm$^3$, depending on the target manufacturing conditions (e.g. powder of sprayed particles).

In some embodiments, the lamellas include the previously described lamellas 101, 102 of pure Si and/or zirconium oxide, preferably sub-oxidic zirconium oxide, and/or a mixed oxide compound, e.g. a $SiZr_nO_m$ mixed oxide compound.

Targets with lamellar structure, produced by spraying, usually comprise roughened surfaces and/or pores, which improves the sputtering of particles of the substrate.

In some embodiments, the surface of the target can be polished to reduce its roughness and possible subsequent problems during sputtering such as arcing. For example, in some embodiments of the present invention, a porosity below 20%, preferably below 15%, preferably 10% and most preferably below 5% is attained for $SiZr_xO_y$ targets which may be beneficial in terms of reducing thermal stress during deposition.

The target of the present invention may be a tubular (e.g. prismatic, cylindrical, etc.) or planar target, the present invention not being limited by any specific shape of the target. The backing substrate 105 may include or be made of stainless steel, for example, and it may optionally include other features such as cooling systems and the like. Additionally, a bond layer or coat 106 may be included to promote adhesion of the target material. The bond layer 106 may be any suitable layer known by the skilled person. The present invention may also provide a free standing planar target, without a backing substrate.

In some embodiments, the target presents a structure such that, when XRD analysis is performed thereon, the pattern presents specific Si-related and zirconium oxide related peaks. An analysis of particular XRD patterns is done below. Specifically, the target may present Si peaks and/or peaks related to tetragonal and monoclinic peaks of zirconium oxide, in particular at the angular 2 Theta positions of 30.050+/−0.3° and 31.2°+/−0.3°.

The target of the present invention can be used for obtaining a material layer on a substrate by sputtering. For example, the sputter target in accordance with some embodiments of the present invention can be used in a reactive sputtering process; e.g. containing a reactive gas which may be preferentially oxygen, nitrogen or a mixture of both. The substrate may be any suitable substrate such as glass, plastic, etc.

Reactive sputtering is preferred because it allows controlling and providing the desired stoichiometric composition, starting from a sub-stoichiometric target material. Additionally, controlling the reactive gas flow along the target length may contribute in obtaining a layer with higher thickness uniformity, for example highly uniform films can be obtained over a large area on the substrate. Good control of thickness of the deposited layer can also be obtained. Reactive sputtering includes performing a sputtering process in a reactive gas, for instance including oxygen and/or nitrogen. The target may comprise lamellas with a mixture of silicon (e.g. pure silicon) and zirconium oxides (e.g. sub-oxidic oxides). If the target would consist of only oxide compositions, although it is possible to obtain a transparent film, the target is non-conductive and the deposition is slow, while if the target is completely non-oxidic, the reactive gas should have a high concentration of oxygen and/or nitrogen, and sputtering is difficult to control.

The target, in accordance with some embodiments of the present invention, may be used to form a transparent layer for which the optical properties may vary depending on the target composition and type of reactive gas present during sputtering. For example, the refractive index n may be tuned between 1.5 and 2.0. The layer may comprise a SZO compound, and the relative amount of Si and Zr, and their respective oxides, may be tailored to obtain a predetermined index n. The SZO ceramic target may also be sputtered in nitride mode to grow silicon zirconium oxynitride transparent films with no oxygen in the gas mixture, resulting in no oxygen gas hysteresis and much better process stability. The target can, for example, also be used for large area glass coating, e.g. for anti-reflective coatings, low emissivity or heat reflecting applications, or other types of optical coatings.

The target, in accordance with some embodiments of the present invention, may be used to form a layer (e.g. an optical layer, such as a transparent layer) with higher scratch and abrasion resistance, thanks to the mixture of Si and Zr. The layer may present different degrees of crystallinity, e.g. it may be amorphous, improving chemical stability (because there are no grain boundaries, thus less paths of diffusion of corrosive elements).

A multilayer film can also be obtained, with controllable optical and mechanical properties, for example by varying the amount of oxygen and/or nitrogen in the environmental gas. For example, the top layer may present higher corrosion and abrasion resistance, may be amorphous, etc. while layers between the top layer and the substrate may have different properties.

The layer or layers with these properties may be obtained advantageously with a single target in accordance with embodiments of the present invention, and optionally in a single step, allowing a simple setup and fast processing of sputtered substrates.

In some embodiments of the present invention, the microstructure of the target presents high homogeneity of composition and grains size, the latter being typically smaller than 100 nm (while the lamellas are usually in the micrometric range). The improved homogeneity and small grain sizes throughout the target thickness, together with a good thermal conductivity of the target layer, will ensure that this stable behavior is maintained throughout the gradual reduction of the thickness of the target layer during the sputtering process. Undesirable effects due to local changes of the properties of the sputter material, such as e.g. arcing, are also strongly reduced and lead to improved homogeneity in the sputter deposited layers of the end product. Due to the higher target thickness it is possible to use the sputter target thereby provided for a significantly longer time in a sputtering process. This leads to a longer operating time per sputter target, which in turn enables longer sputter coating runs without the need to stop the sputtering process to replace the sputter target.

In a second aspect, the present invention provides a method of manufacturing a sputter target in accordance with embodiments of the first aspect of the present invention.

The method comprises the step of projecting at least SZO material over a backing substrate. The material is provided preferably as a powder and it is provided on the substrate by for example thermal spraying. The powder can be molten and projected on the backing substrate, where the projected material cools down and solidifies, thereby obtaining a conductive sputter target including or made of $SiZr_xO_y$, wherein the amount x of Zr is higher than 0.02 but lower not higher than 5, and the amount y of oxygen is higher than 0.03 but not higher than $2*(1+x)$.

The target is produced from source material, for example in powder form. In some embodiments, the source material mainly consists of Si, Zr and O, e.g. at least 80%, 90%, 95%, 99% or even more, for example in the following forms:
- either Si and $ZrO_z$ ($0.25<z<=2$),
- or Zr and $SiO_z$ ($0.25<z<=2$),
- or $SiO_v$ and $ZrO_w$ ($0.1<v<=1.9$; $0.1<w<=2-v$),
- or a $SiZr_aO_b$ compound, where a and b can be, but do not need to be, equal to x and y in the final composition, respectively, which compound may for example be supplemented with metallic or sub-oxidic Si and/or Zr, or a combination of these materials.

Figure 2:
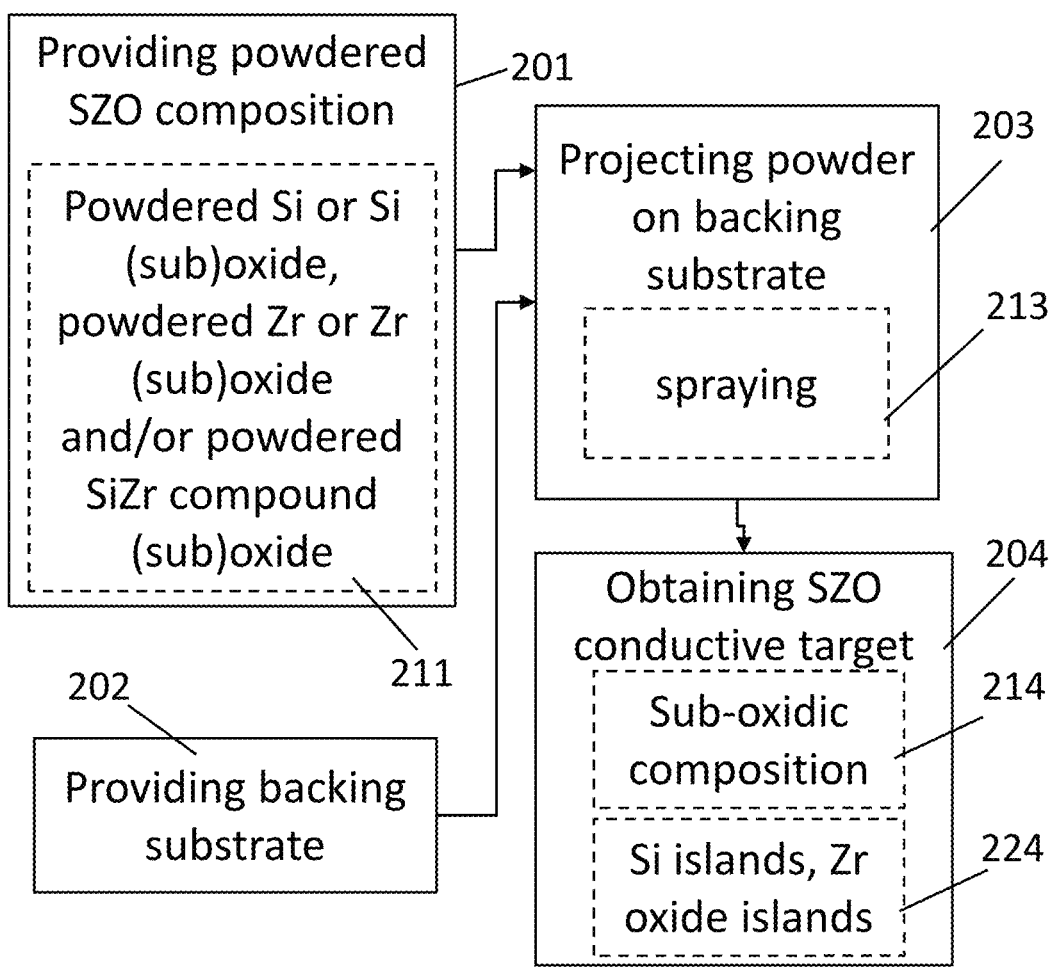
FIG. 2 is a scheme of a process for manufacturing a target in accordance with embodiments of the present invention.

The diagram of FIG. 2 shows the steps and optional steps of a method in accordance with embodiments of the present invention. The method comprises the steps of providing 201 a powder which comprises silicon and zirconium oxide or suboxide; and/or zirconium and silicon oxide or suboxide particles; and/or silicon suboxide and zirconium suboxide; and/or powdered silicon-zirconium oxide as separate or compound material. This may include providing 211 for example silicon ((sub)oxide) particles and zirconium ((sub)oxide) particles in powder form.

It is an advantage of embodiments of the present invention that the use of pure zirconium in powder form is not necessarily required, thereby reducing fire hazard, because the present invention may use oxides or compounds of zirconium which are less or not at all flammable. It is also an advantage of embodiments of the present invention that a conductive sputter target can be sputtered in pure nitrogen or nitrogen/argon reactive atmosphere for providing silicon zirconium oxynitride layers, with little or no use of oxygen in the gas mixture.

The method further comprises providing 202 a backing substrate, which may be a planar substrate, a tubular (e.g. prismatic, cylindrical) substrate, etc. For example, it may be a stainless steel backing substrate, or a copper, molybdenum, or titanium backing substrate, which optionally may include a cooling system.

The method further comprises projecting 203 the particles over the backing substrate, for example by spraying 213, e.g. thermal spraying, in such quantities that a final target with composition $SiZr_xO_y$, wherein x is higher than 0.02 but not higher than 5, and y is higher than 0.03 but not higher than $2*(1+x)$, is obtained.

The thermal spray process consists in accelerating and projecting droplets of at least partially molten source materials (comprising Si, Zr, in metallic or in oxidic state; possibly also metallic components such as Al, Cu, . . . ) onto the sputtering backing substrate, where they flatten upon impact and solidify to form a coating. The feedstock powder particles are typically in the size range from 10 to 200 microns and flow freely, which allows these powders to be fed consistently into a spray apparatus while being carried by a gas, typically argon, through the feeding hoses and injectors to the apparatus. In embodiments of the present invention, different types of thermal spraying, such as flame spraying, plasma spraying, even cold spraying (if particles are plastically deformable, e.g. metal particles), or HVOF may be applied.

The environment of the sputtering process can be controlled during the target production, which allows controlling the degree of oxidation and of reduction of the raw base material.

Unlike prior art sputterable targets made by the process of sintering and bonding, the method of the present invention allows using the target in sputtering with high power densities and deposition rates, as there is an optimal adhesion to the backing substrate, possibly due to the presence of bonding material. Moreover, the process of spraying allows good control of thickness and composition of the target material.

The method thus allows obtaining 204 a SZO conductive target with composition in accordance with embodiments of the first aspect. It may comprise obtaining 214 a sub-oxidic SZO composition. For example, this can be done by providing sub-oxidic oxide particles as a source material, or for example it may occur during thermal spraying. More in detail, oxygen may be lost due to heating. In some embodiments, the oxygen is not regained. This results in a sub-oxidic SZO composition. For example, in some embodiments, thermal spraying advantageously allows using powder of oxide material, while at the same time allowing reducing the amount of oxygen in the oxide by thermal effects (e.g. heating the oxide powder), thus obtaining 214 a sub-oxidic compound on the final target, thus reducing the resistance thereof.

The method in accordance with embodiments of the present invention may provide a target 100 as shown in FIG. 1, including a backing substrate 105 and a deposited top coat 104 of material for sputtering. The top coat 104 may have a thickness of 1 mm, although several millimeters are preferred, e.g. at least 4 mm, or between 4 mm and 12 mm, or even higher. For example, 6 mm or 9 mm, can be provided.

The method may comprise obtaining 224 targets which include lamellas of pure Si, and lamellas of $ZrO_z$, preferably with a sub-oxidic composition. The size of the lamellas may be controlled by the size of the powder particles. The size of the lamella may increase for each material in accordance with its concentration. The composition may be controlled mainly by controlling the feedstock In some embodiments, the step of providing powder comprises providing particles of a further metal such as Ti, Zr, Nb, W, Cu, Al, B, etc. The powder can also be molten and sputtered, thus obtaining a target in accordance with embodiments of the present invention with a low resistivity.

The method may comprise other steps, for example providing cooling of the backing substrate (e.g. by making use of a backing substrate including a cooling system, or by providing external cooling), and/or providing an intermediate tie layer for improving adhesion of the target material to the backing substrate.

The sputter target substrate may be composed of a backing substrate 105 and optionally bond coat, such as for instance a metal, e.g. comprising Al, Cu, Ni or other metallic elements, or mixtures thereof, such as Ni—Al alloys. In some embodiments, the method includes providing this bond coat 106.

Analysis of Exemplary Targets

Figure 3:
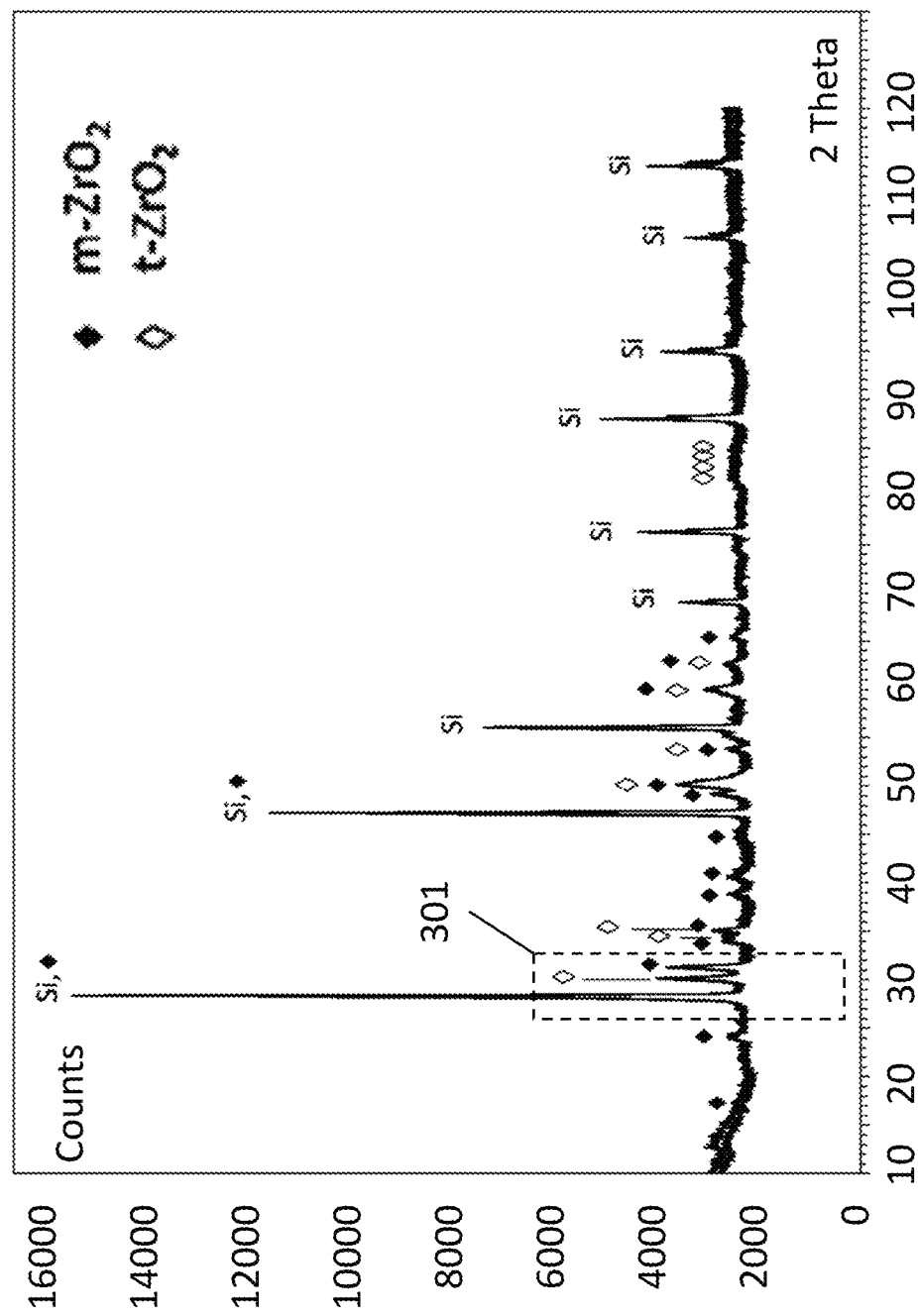
FIG. 3 shows an XRD pattern obtained from target material from two targets in accordance with embodiments of the present invention.

FIG. 3 shows an XRD pattern by "powder XRD" of two 35 inch Si:ZrO$_Z$ targets, with z being approximately 1.85 with which roughly corresponds to a target composition of x close to 0.23 and a value of y close to 0.42 for SiZr$_x$O$_y$. The targets were manufactured by spraying of Si and zirconium oxide powder, comprising monoclinic ZrO$_2$ powder. The measurement results of the two targets are both graphed and substantially overlap in position.

Figure 4:
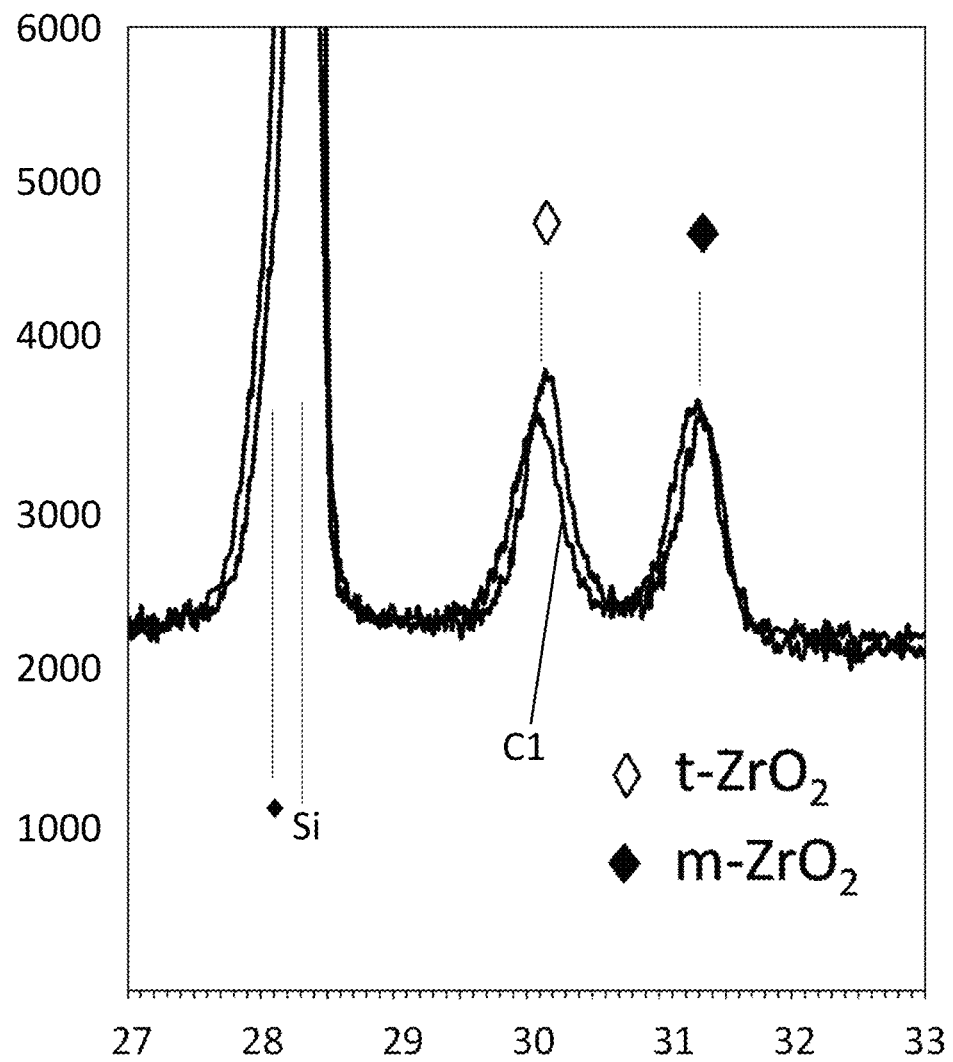
FIG. 4 shows a zoomed portion of the XRD pattern of FIG. 3, showing two peaks corresponding to different phases of a zirconium oxide.

The measurement of the XRD peaks is done under Cu K-alpha radiation. It is shown that only Si and ZrO$_2$ peaks are present. Both monoclinic m-ZrO$_2$ and tetragonal t-ZrO$_2$ phases are detected. Part of these peaks are shown in FIG. 4, corresponding to the zoomed portion 301 of FIG. 3. No SiO$_2$ peak, nor peaks related to other Si—O phases, have been detected.

In particular, the analysis of the peaks of FIG. 4 shows that, despite the feedstock being monoclinic ZrO$_2$ powder, a tetragonal t-ZrO$_2$ phase is present. It is suggested that this phase is formed due to the thermal spray. Further, the relative intensity r between tetragonal and monoclinic phases at the positions of ~30° and ~31.2°, respectively, is in general r≥0.1. In this particular example the relative intensity t-ZrO$_2$/m- ZrO$_2$ is close to 1.

The grain size, obtained by the Scherrer analysis, is approximately 20 nm for ZrO$_2$ and approximately 40 nm for Si.

Figure 5:
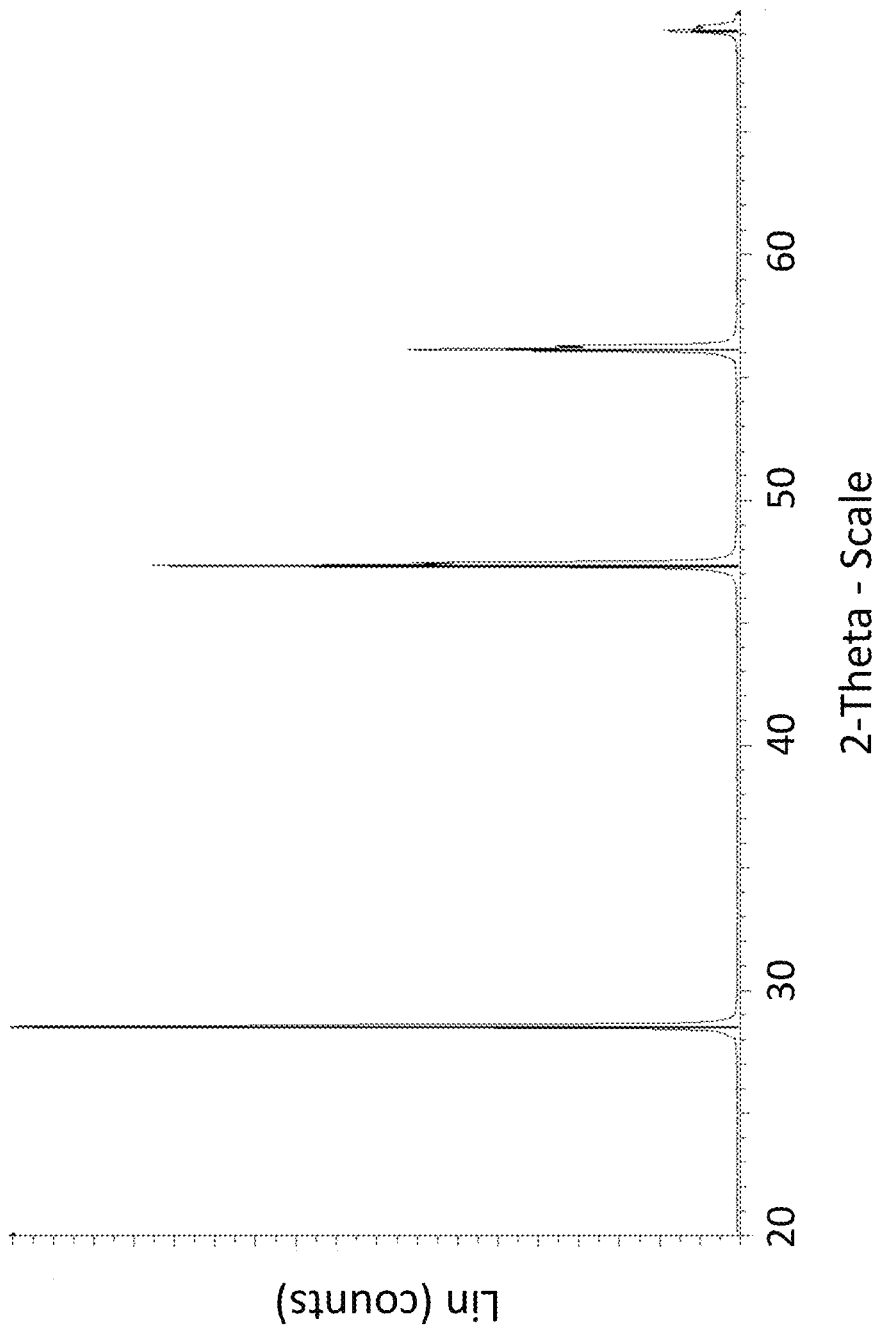
FIG. 5 shows an XRD pattern of a comparative example of thermal sprayed high purity silicon powder.

FIG. 5 shows an XRD pattern obtained from thermally sprayed pure silicon powder. The same Si XRD peaks are detected in the case of the sprayed SZO target in FIG. 3, and the same K-α$_2$ line peak splitting is also observed.

Figure 6:
FIG. 6 and FIG. 7 show two electron microscopy images at different magnifications, showing the splats or lamellas, of a cross section of a target in accordance with embodiments of the present invention.
Figure 7:
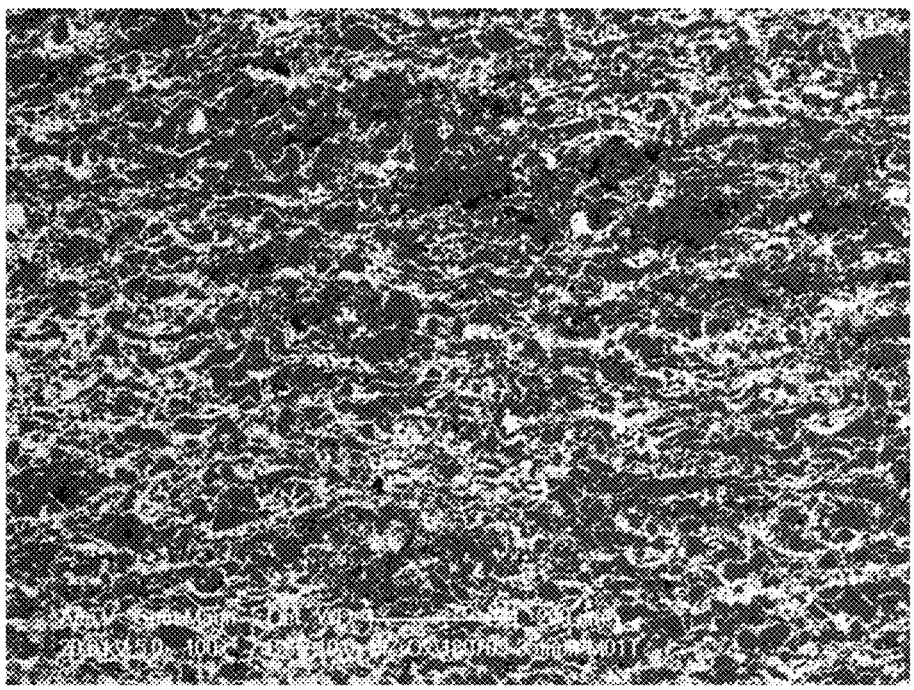

FIG. 6 and FIG. 7 show two electron microscope (EM) images in backscattered electrons (BSE) mode. These are two images of the same target at 50× and 100× magnification factors, respectively. These images are representative of the typical target microstructure, where the grey value maps the Z (atomic mass) of the material. Heavier atoms give more scattering and a lighter image, while lighter elements provide a darker image. FIG. 6 shows the characteristic lamellar structure of the coating and a homogenous distribution of the Si (dark grey) and ZrO$_Z$ materials (white). Especially the image of FIG. 7 (on a 200 μm scale) shows higher contrast, revealing the separate splats of Si and ZrO$_Z$, together with some porosity (black dots).

A series of SiZr$_x$O$_y$ target samples have been produced by varying the production method and by changing the relative concentration of Si-containing particles and Zr-containing particles. Over this series of samples, a variation of SiZr$_x$O$_y$ target composition was obtained, with x higher than 0.04 and lower than 0.5, while an y-value is found between 0.1 and 1.

Additionally, the resistivity and resistance of target material of the exemplary targets, having a material thickness of approximately 9 mm, have been measured by different methods, shown in FIG. 8 to FIG. 11. The target 100 is placed on a carrier backing, for instance carrier backing tube 107, and different probes are applied to the surface of the target.

Figure 8:
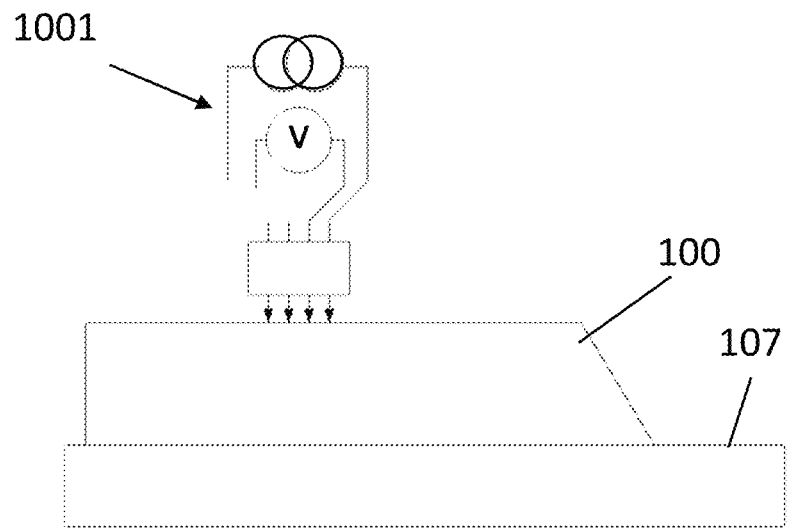
FIG. 8 to FIG. 11 show different setups for measuring resistivity (FIG. 8 and FIG. 9) and resistance (FIG. 10 and FIG. 11) of a target in accordance with embodiments of the present invention.

A 4-point method of measuring resistivity, for which a set-up is shown in FIG. 8, is based on a 4 point probe 1001 including a voltage source providing a voltage V and a current source providing a current I. The resistivity is obtained from the equation:

$$\rho = \frac{V}{I} \frac{\pi t}{\ln\left(\frac{\sinh\left(\frac{t}{s}\right)}{\sinh\left(\frac{t}{2s}\right)}\right)}$$

where the parameters t and s are respectively the thickness of the target and the space between contacts. This can be simplified to:

ρ=2*π*s*V/I

Figure 9:
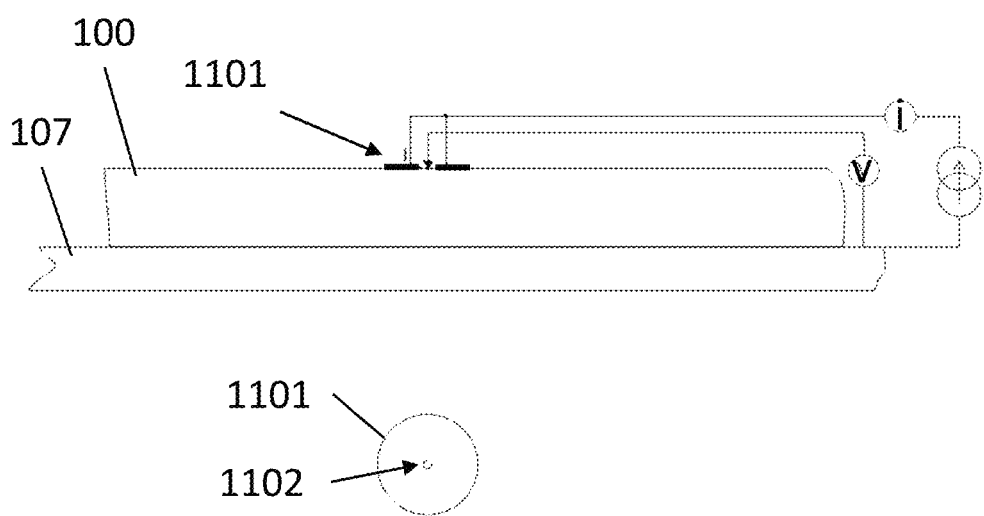

The minimum and maximum measured resistivity by the 4 point method, using a spacing of 1.59 mm between the contacts, is ρmin: 2 Ω·cm, ρMax: 3 Ω·cm A 3-point method of measuring resistivity, for which a set-up is illustrated in FIG. 9, is based on sending a current through a predetermined area (circular area provided by a circular plate 1101, in the present example) and measure the current and voltage of the target, in this case measured through the center 1102 of the plate 1101. The resistivity is obtained from the equation:

V/I=R=ρ·D/S

Where D is the thickness (cm) and S the contact surface (cm$^2$).

The results are ρmin: 1 Ω·cm ρMax: 3 Ω·cm.

Figure 10:
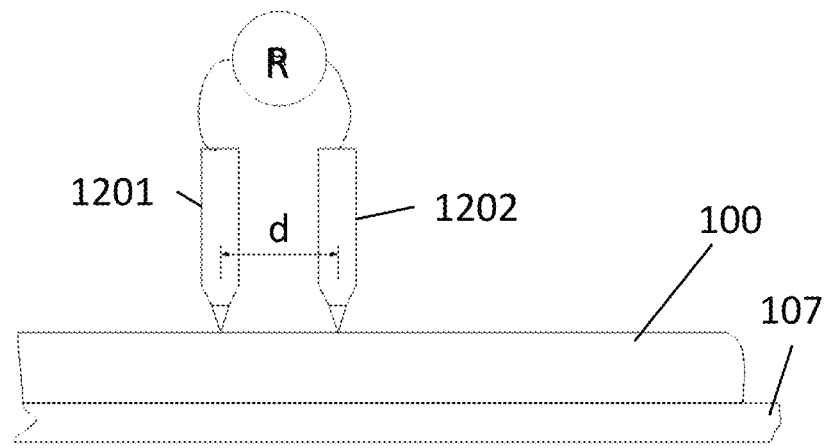

A 2-point method, for which a set-up is shown in FIG. 10, simply measures the resistance between two probes 1201, 1202 (probes with steel point or Ni plated brass probes), at a predetermined distance d, in this case 10 mm. These are the results of the resistance measurement:

Ni plated brass, min: 100Ω max: 400 Ω

Steel points min: 200Ω max: 300 Ω

Supposing a resistivity of 2 Ω·cm, the theoretical simulation for the resistance is approximately 300Ω.

Figure 11:
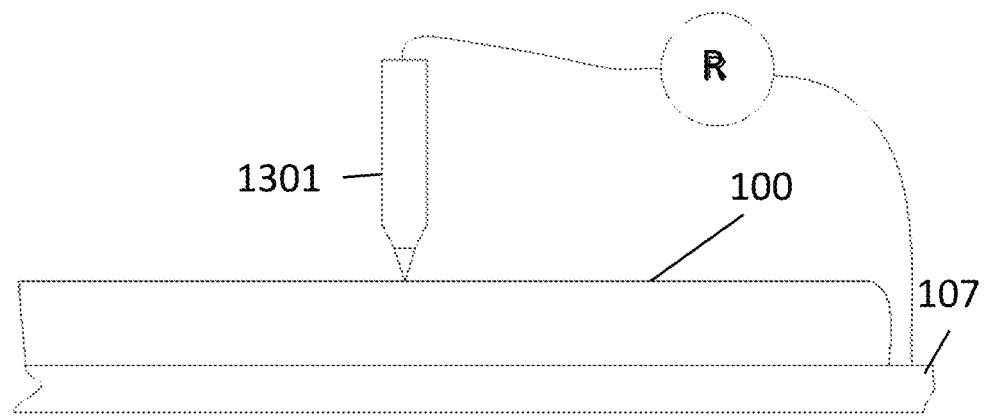

A single point method, for which a set-up is illustrated in FIG. 11, is based on measuring the resistance between the target surface and the backing tube using a probe 1301. These are the results of the resistance measurements:

Ni plated brass, min: 60Ω max: 200 Ω

Steel points min: 80Ω max: 160 Ω

Theoretical simulation for 2 Ω·cm: R~ 200 Ω

It is thus shown that the exemplary targets obtained by the present invention have a resistivity under 10 Ω·cm (even under 3 Ω·cm). Thus, the targets can be considered conductive.

The invention claimed is:

1. A target for sputtering comprising SiZr$_x$O$_y$, wherein x is higher than 0.02 but not higher than 5, and y is higher than 0.03 but not higher than 2*(1+x), comprising at least 50 at % of SiZr$_x$O$_y$, wherein the target has an XRD pattern, measured under Cu K-alpha radiation, with a silicon 2-Theta peak at 28.29°+/−0.3°, or a tetragonal phase ZrO$_2$ 2-Theta peak at 30.05°+/−0.3°.

2. The target according to claim 1, wherein the SiZr$_x$O$_y$ fraction has a lamellar structure consisting of microscopic splats of material.

3. The target of claim 1, wherein the target comprises more than 90% of Si, Zr, and O elements.

4. The target of claim 3, having a resistivity below 1000 ohm·cm.

5. The target of claim 1, wherein x is higher than 0.05 but lower than 1, and y is higher than 0.1 but lower than 2*(0.6+x).

6. The target of claim 1, wherein the target comprises lamellas consisting of Si and lamellas consisting of ZrO$_z$, where z is higher than 0.05 but lower than or equal to 2.

7. The target of claim 1, wherein the target comprises at least 1 wt % of lamellas consisting of a mixed oxide compound.

8. The target of claim 1, wherein the target further comprises metallic particles.

\* \* \* \* \*